US009412580B2

(12) United States Patent
Arena et al.

(10) Patent No.: US 9,412,580 B2
(45) Date of Patent: Aug. 9, 2016

(54) METHODS FOR FORMING GROUP III-NITRIDE MATERIALS AND STRUCTURES FORMED BY SUCH METHODS

(75) Inventors: Chantal Arena, Mesa, AZ (US); Ronald Thomas Bertram, Jr., Mesa, AZ (US); Ed Lindow, Cornville, AZ (US); Subhash Mahajan, El Macero, CA (US); Fanyu Meng, Tempe, AZ (US)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/988,996

(22) PCT Filed: Nov. 23, 2011

(86) PCT No.: PCT/EP2011/070794
§ 371 (c)(1),
(2), (4) Date: May 22, 2013

(87) PCT Pub. No.: WO2012/069530
PCT Pub. Date: May 31, 2012

(65) Prior Publication Data
US 2013/0234157 A1  Sep. 12, 2013

Related U.S. Application Data

(60) Provisional application No. 61/416,574, filed on Nov. 23, 2010.

(30) Foreign Application Priority Data

Dec. 8, 2010  (FR) ...................... 10 60242

(51) Int. Cl.
*H01L 21/02* (2006.01)
*C30B 25/02* (2006.01)
(Continued)

(52) U.S. Cl.
CPC .......... *H01L 21/02104* (2013.01); *C30B 25/02* (2013.01); *C30B 29/403* (2013.01); *C30B 29/406* (2013.01); *H01L 29/2003* (2013.01)

(58) Field of Classification Search
CPC ..................... H01L 21/0254; H01L 21/02104; H01L 21/02458; H01L 21/02645; H01L 21/02667; C30B 25/02; C30B 29/403
See application file for complete search history.

(56) References Cited

U.S. PATENT DOCUMENTS 5,232,508 A  8/1993  Arena et al.
5,635,093 A  6/1997  Arena et al.
(Continued)

FOREIGN PATENT DOCUMENTS

EP       1732145 A2   12/2006
JP      2005019872    1/2005
(Continued)

OTHER PUBLICATIONS

Arena et al., Gas Injectors for CVD Systems with the Same, U.S. Appl. No. 61/157,112, filed Mar. 3, 2009.
(Continued)

*Primary Examiner* — Tucker J Wright
(74) *Attorney, Agent, or Firm* — TraskBritt

(57) ABSTRACT

Embodiments of the invention include methods for forming Group III-nitride semiconductor structure using a halide vapor phase epitaxy (HVPE) process. The methods include forming a continuous Group III-nitride nucleation layer on a surface of a non-native growth substrate, the continuous Group III-nitride nucleation layer concealing the upper surface of the non-native growth substrate. Forming the continuous Group III-nitride nucleation layer may include forming a Group III-nitride layer and thermally treating said Group III-nitride layer. Methods may further include forming a further Group III-nitride layer upon the continuous Group III-nitride nucleation layer.

15 Claims, 3 Drawing Sheets

(51) Int. Cl.
*C30B 29/40* (2006.01)
*H01L 29/20* (2006.01)

(56) References Cited

U.S. PATENT DOCUMENTS

| | | | |
|---|---|---|---|
| 5,972,790 A | 10/1999 | Arena et al. | |
| 6,090,705 A | 7/2000 | Arena et al. | |
| 6,121,140 A | 9/2000 | Arena et al. | |
| 6,179,913 B1 | 1/2001 | Solomon et al. | |
| 6,325,850 B1 | 12/2001 | Beaumont et al. | |
| 6,613,143 B1 | 9/2003 | Melnik et al. | |
| 7,427,556 B2 | 9/2008 | Tomasini et al. | |
| 7,452,757 B2 | 11/2008 | Werkhoven et al. | |
| 7,514,372 B2 | 4/2009 | Arena et al. | |
| 7,666,799 B2 | 2/2010 | Arena et al. | |
| 7,732,306 B2 | 6/2010 | Arena et al. | |
| 7,785,995 B2 | 8/2010 | Cody et al. | |
| 7,816,236 B2 | 10/2010 | Bauer et al. | |
| 7,902,045 B2 | 3/2011 | Arena et al. | |
| 7,928,447 B2* | 4/2011 | Matsuoka et al. | 257/79 |
| 8,154,022 B2 | 4/2012 | Arena et al. | |
| 8,178,427 B2 | 5/2012 | Arena et al. | |
| 8,197,597 B2 | 6/2012 | Arena et al. | |
| 8,236,593 B2 | 8/2012 | Arena et al. | |
| 8,247,314 B2 | 8/2012 | Arena | |
| 8,278,193 B2 | 10/2012 | Arena | |
| 8,318,612 B2 | 11/2012 | Arena et al. | |
| 8,323,407 B2 | 12/2012 | Arena et al. | |
| 8,329,565 B2 | 12/2012 | Arena et al. | |
| 8,367,520 B2 | 2/2013 | Arena | |
| 8,377,802 B2 | 2/2013 | Lindow et al. | |
| 8,382,898 B2 | 2/2013 | Arena et al. | |
| 8,388,755 B2 | 3/2013 | Arena et al. | |
| 8,431,419 B2 | 4/2013 | Bertram, Jr. et al. | |
| 2002/0014629 A1* | 2/2002 | Shibata et al. | 257/79 |
| 2002/0028291 A1* | 3/2002 | Shibata et al. | 427/255.39 |
| 2003/0186088 A1* | 10/2003 | Kato et al. | 428/698 |
| 2003/0207125 A1* | 11/2003 | Sunakawa et al. | 428/428 |
| 2004/0097022 A1 | 5/2004 | Werkhoven et al. | |
| 2004/0259333 A1 | 12/2004 | Tomasini et al. | |
| 2005/0042787 A1* | 2/2005 | Ito et al. | 438/41 |
| 2005/0042789 A1 | 2/2005 | Fujikura et al. | |
| 2005/0051795 A1 | 3/2005 | Arena et al. | |
| 2006/0234504 A1 | 10/2006 | Bauer et al. | |
| 2007/0072320 A1 | 3/2007 | Frayssinet et al. | |
| 2007/0264801 A1 | 11/2007 | Cody et al. | |
| 2008/0026149 A1 | 1/2008 | Tomasini et al. | |
| 2008/0121903 A1* | 5/2008 | Hiramatsu et al. | 257/89 |
| 2008/0303118 A1 | 12/2008 | Arena et al. | |
| 2009/0026466 A1* | 1/2009 | Kikkawa | 257/77 |
| 2009/0050928 A1* | 2/2009 | Fujikura | 257/103 |
| 2009/0091002 A1* | 4/2009 | Arena et al. | 257/623 |
| 2009/0098343 A1 | 4/2009 | Arena et al. | |
| 2009/0155989 A1* | 6/2009 | Uematsu et al. | 438/507 |
| 2009/0178611 A1 | 7/2009 | Arena et al. | |
| 2009/0189185 A1 | 7/2009 | Arena et al. | |
| 2009/0205563 A1 | 8/2009 | Arena et al. | |
| 2009/0214785 A1 | 8/2009 | Arena et al. | |
| 2009/0223441 A1 | 9/2009 | Arena et al. | |
| 2009/0223442 A1 | 9/2009 | Arena et al. | |
| 2009/0223453 A1 | 9/2009 | Arena et al. | |
| 2009/0283029 A1 | 11/2009 | Arena et al. | |
| 2010/0072576 A1 | 3/2010 | Arena | |
| 2010/0109126 A1 | 5/2010 | Arena | |
| 2010/0124814 A1* | 5/2010 | Arena | 438/504 |
| 2010/0133548 A1 | 6/2010 | Arena et al. | |
| 2010/0180913 A1 | 7/2010 | Arena et al. | |
| 2010/0187568 A1 | 7/2010 | Arena | |
| 2010/0242835 A1 | 9/2010 | Arena et al. | |
| 2010/0244197 A1 | 9/2010 | Arena et al. | |
| 2010/0244203 A1 | 9/2010 | Arena | |
| 2010/0258053 A1 | 10/2010 | Arena et al. | |
| 2010/0275836 A1* | 11/2010 | Sato et al. | 117/97 |
| 2011/0011450 A1 | 1/2011 | Arena | |
| 2011/0024747 A1 | 2/2011 | Arena et al. | |
| 2011/0037075 A1 | 2/2011 | Arena et al. | |
| 2011/0057294 A1 | 3/2011 | Arena | |
| 2011/0101373 A1 | 5/2011 | Arena et al. | |
| 2011/0156212 A1 | 6/2011 | Arena | |
| 2011/0212546 A1 | 9/2011 | Bertram, Jr. et al. | |
| 2011/0212603 A1 | 9/2011 | Arena et al. | |
| 2011/0277681 A1 | 11/2011 | Arena et al. | |
| 2011/0284863 A1 | 11/2011 | Lindow et al. | |
| 2011/0305835 A1 | 12/2011 | Bertram, Jr. et al. | |
| 2012/0048182 A1 | 3/2012 | Arena et al. | |
| 2012/0085400 A1 | 4/2012 | Arena et al. | |
| 2012/0132922 A1 | 5/2012 | Arena et al. | |
| 2012/0187541 A1 | 7/2012 | Arena et al. | |
| 2012/0199845 A1 | 8/2012 | Werkhoven et al. | |
| 2012/0211870 A1 | 8/2012 | Figuet et al. | |
| 2012/0280249 A1 | 11/2012 | Arena | |
| 2012/0319128 A1 | 12/2012 | Arena | |
| 2013/0052333 A1 | 2/2013 | Lindow et al. | |
| 2013/0052806 A1 | 2/2013 | Bertram, Jr. et al. | |

FOREIGN PATENT DOCUMENTS

| | | |
|---|---|---|
| WO | 03097532 A1 | 11/2003 |
| WO | 2004105108 A2 | 12/2004 |
| WO | 2010089623 A1 | 8/2010 |

OTHER PUBLICATIONS

Ashraf et al, Reduction of the Dislocation Density in HVPE-Grown GaN Epi-Layers by and In Situ SiNx Treatment, Journal of Crystal Growth, vol. 312 (2010) pp. 595-600.

Bohnen et al, The Nucleation of HCl and Cl2-Based HVPE GaN on Mis-Oriented Sapphire Substrates, Phys. Status Solidi, vol. C7, No. 7-8 (2010) pp. 1749-1755.

Datta et al., Mechanisms of Bending of Threading Dislocations in MOVPE-Grown GaN on (0001) Sapphire, Phys. Stats. Sol (c) 3, No. 6 (2006), pp. 1750-1753.

French Search Report and Opinion for French Application No. 1060242 dated Jun. 30, 2011, 13 pages.

Kim et al., Pre-Treatment of Low Temperature GaN Buffer Layer Deposited on AlN Si Substrate by Hydride Vapor Phase Epitaxy, Surface and Coatings Technology, vol. 131 (2000) pp. 465-469.

Lee et al., Accelerated Surface Flattening by Alternating a Ga Flow in Hydride Vapor Phase Epitaxy, Journal of Crystal Growth, vol. 311 (2009), pp. 3025-3028.

Richter et al., Direct Growth of GaN on (0001) Sapphire by Low Pressure Hydride Vapour Phase Epitaxy, Phys. Stat. Sol. (a) vol. 188, No. 1 (2001) pp. 439-442.

Richter et al., Reactor and Growth Process Optimization for Growth of Thick GaN Layers on Sapphire Substrates by HVPE, Journal of Crystal Growth, vol. 277 (2005), pp. 6-12.

Tavernier et al., Two-Step Growth of High-Quality GaN by Hydride Vapor-Phase Epitaxy, Applied Physics Letters, vol. 77, No. 12, Sep. 18, 2000, pp. 1804-1806.

Zhang et al., Dislocation Reduction in GaN Grown by Hydride Vapor Phase Epitaxy Via Growth Interruption Modulation, Applied Physics Letters, vol. 78, No. 6, Feb. 5, 2001, pp. 772-774.

Zhang et al., Modulated Growth of Thick GaN with Hydride Vapor Phase Epitaxy, Journal of Crystal Growth, vol. 234 (2002) pp. 616-622.

Japanese Office Action for Japanese Application No. 2013-540344 dated Mar. 10, 2015.

Japanese Final Office Action for Japanese Application No. 2013-540344 dated Nov. 17, 2015.

Chinese Second Office Action for Chinese Application No. 201180056001.2 dated Mar. 21, 2016.

* cited by examiner

METHODS FOR FORMING GROUP III-NITRIDE MATERIALS AND STRUCTURES FORMED BY SUCH METHODS

CROSS-REFERENCE TO RELATED APPLICATIONS

This application is a national phase entry under 35 U.S.C. §371 of International Patent Application PCT/EP2011/070794, filed Nov. 23, 2011, designating the United States of America and published in English as International Patent Publication WO 2012/069530 A1 on May 31, 2012, which claims the benefit under Article 8 of the Patent Cooperation Treaty and under 35 U.S.C. §119(e) to United States Provisional Patent Application Serial No. 61/416,574, filed Nov 23, 2010, and to French Patent Application Serial No. 1060242, filed Dec. 8, 2010, the disclosure of each of which is hereby incorporated herein by this reference in its entirety.

FIELD

The various embodiments of the present invention generally relate to methods for forming Group III-nitride materials on growth substrates and structures formed by such methods and, more particularly, to methods for forming Group III-nitride semiconductor structures by halide vapor phase epitaxy (HVPE) utilizing a chlorinated gas chemistry and structures formed by such methods.

BACKGROUND

Group III-nitrides may include one or more materials, such as, for example, gallium nitride (GaN), indium nitride (InN), aluminum nitride (AlN) and their alloys (InGaN, AlGaN and InAlGaN). One or more methods may be utilized for the formation of Group IIII-nitrides. For example, formation methods may comprise metalorganic chemical vapor deposition (MOCVD), halide vapor phase epitaxy (HVPE), molecular beam epitaxy (MBE) and atomic layer deposition (ALD).

Group III-nitrides are commonly deposited heteroepitaxially upon "non-native" growth substrates, i.e., upon growth substrates which do not comprise a Group III-nitride growth surface. For example, sapphire growth substrates are commonly utilized as "non-native" growth substrates when performing heteroepitaxial deposition of Group III-nitrides. Heteroepitaxial deposition of Group III-nitrides may be employed since native Group III-nitride growth substrates may be cost prohibitive and relatively difficult to obtain.

Heteroepitaxial deposition of Group III-nitrides commonly proceeds with the formation of a nucleation layer upon the growth substrate, followed by the deposition of the remaining bulk of the Group III-nitride. MOCVD methods and systems have proven relatively successful in forming such nucleation layers and bulk materials directly on "non-native" growth substrates. However, MOCVD methods and systems commonly deposit Group III-nitride material at relative slow rates, i.e., approximately less than 3-4 µm of material per hour. In addition, MOCVD methods and system commonly utilize cost prohibitive metallorganic precursors.

Conversely, HVPE methods and systems commonly deposit Group III-nitrides at rapid growth rates. For example, growth rates over 100 µm of material per hour are commonly achievable utilizing HVPE systems and methods. In addition, HVPE systems and methods commonly utilize cost effective gallium chloride precursors. However, HVPE systems and methods have proven less successful in forming nucleation layers and bulk material directly on "non-native" growth substrates.

BRIEF SUMMARY

The various embodiments of the present invention generally relate to methods for forming Group III-nitrides and structures formed by such methods and, more particularly, to methods for forming Group III-nitrides and structures formed by such methods.

The methods and structures are now briefly described in terms of embodiments of the invention. This summary is provided to introduce a selection of concepts in a simplified form that are further described in the detailed description of the embodiments of the invention. This summary is not intended to identify key features or essential features of the claimed subject matter, nor is it intended to be used to limit the scope of the claimed subject matter.

Therefore, embodiments of the present invention may include methods for forming a group III-nitride, material on a growth substrate. Such methods may include forming a group III-nitride nucleation layer over a surface of a non-native growth substrate and forming a further group III-nitride layer over the nucleation layer. The group III-nitride nucleation layer may be formed by depositing a group III-nitride layer that includes a plurality of wurtzite crystal structures on an upper surface of the non-native growth substrate using a halide vapor phase epitaxy (HVPE) process and thermally treating the group III-nitride layer. Thermally treating the group III-nitride nucleation layer may also substantially reduce a concentration of chlorine species therein. The various embodiments of the invention may also include structure a group III-nitride layer extending substantially continuously over an surface of a growth substrate. The group III-nitride layer may include a plurality of wurtzite crystal structures adjacent to and crystallogaphically aligned with the surface of the growth substrate, an amorphous group III-nitride material enveloping the plurality of wurtzite crystal structures, and a plurality of misaligned crystal structures, the plurality of misaligned crystal structures disposed within the amorphous group III-nitride material.

Further aspects and details and alternate combinations of the elements of this invention will be apparent from the following detailed description and are also within the scope of the invention.

BRIEF DESCRIPTION OF THE DRAWINGS

Embodiments of the present invention may be understood more fully by reference to the following detailed description of example embodiments, which are illustrated in the appended figures in which.

DETAILED DESCRIPTION OF EMBODIMENTS OF THE INVENTION

Figure 1A:
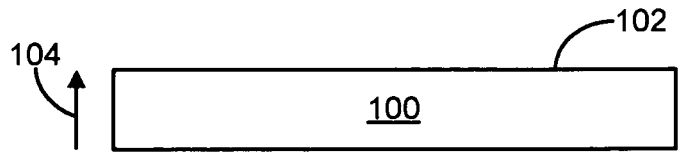
FIGS. 1A through 1F schematically illustrate example embodiments of the invention for forming Group III-nitride semiconductor structures.

The illustrations presented herein are not meant to be actual views of any particular method, structure, material, or system but are merely idealized representations that are employed to describe the present invention.

Headings are used herein for clarity only and without any intended limitation. A number of references are cited herein, none of the cited references, regardless of how characterized above, are admitted as prior art relative to the invention of the subject matter claim herein.

As used herein, the term "Group III-nitride" means and includes any material predominantly comprised of one or more elements from Group IIIA of the periodic table (Al, Ga, and In) and nitrogen (N).

As used herein, the term "growth substrate" means and includes any structure upon which a Group III-nitride is intentionally formed.

As used herein, the term "non-native" growth substrate means and includes any growth substrate that includes a growth surface that is not substantially comprised of a Group III-nitride material.

As used herein, the term "nucleation layer" means and includes any initial layer, or plurality of layers, formed upon a surface of a growth substrate prior to deposition of bulk Group III-nitride material thereon.

As used herein, the term sapphire growth substrate means and includes any growth substrate predominantly comprised of alpha aluminum oxide ($\alpha$-$Al_2O_3$).

As used herein, the term "wurtzite crystal structure" means and includes a material having a crystal lattice structure that includes a hexagonal close packed array of anions with cations occupying half of the tetrahedral holes.

As used herein, the terms "chemical vapor deposition" and "CVD" are synonymous and mean and include any process used to deposit solid material(s) on a substrate in a reaction chamber, in which the substrate is exposed to one or more reagent gases, which react, decompose, or both react and decompose in a manner that results in the deposition of the solid material(s) on a surface of the substrate.

As used herein, the terms "vapor phase epitaxy" and "VPE" are synonymous and mean and include any CVD process in which the substrate is exposed to one or more reagent vapors, which react, decompose, or both react and decompose in a manner that results in the epitaxial deposition of the solid material(s) on a surface of the substrate.

As used herein, the terms "halide vapor phase epitaxy" and "HVPE" are synonymous and mean and include any VPE process in which at least one reagent vapor used in the VPE process comprises a halide vapor.

Direct deposition of Group III-nitrides on non-native growth substrates by a halide vapor phase epitaxy (HVPE) process may result in Group III-nitrides of poor crystalline and structural quality. For example, direct HVPE deposition of Group III-nitrides on sapphire growth substrates may result in one or more of, Group III-nitride delamination from the growth substrate, growth of inversion domains (i.e., mixed polarity material) and structural cracks.

Such problems associated with direct HVPE deposition of Group III-nitrides on non-native substrates may be alleviated by employing intermediate Group III-nitride layers deposited by MOCVD methods. The MOCVD Group III-nitride layer may be deposited upon a growth surface of the non-native growth substrate prior to depositing the remainder of the material by HVPE methods and systems. However, the use of such intermediate Group III-nitride layers may increase cost and/or deposition time.

Example embodiments of the invention are described below with reference to FIGS. 1A through 1F. FIG. 1A illustrates a non-native growth substrate 100 which may include, for example, a ceramic such as an oxide (e.g., silicon dioxide ($SiO_2$) or aluminum oxide ($Al_2O_3$) (e.g., sapphire, which is $\alpha$-$Al_2O_3$)) or a nitride (e.g., silicon nitride ($Si_3N_4$) or boron nitride (BN)). As additional examples, the material 242 may comprise a semiconductor material such as silicon (Si), germanium (Ge), a III-V semiconductor material, etc. For example, the growth substrate 100 may comprise (0001) sapphire in some embodiments. The non-native growth substrate 100 may include a number of surfaces, including an upper surface 102, which may be referred to herein as a "growth surface." The non-native growth substrate 100 may have a selected crystallographic orientation, such that the exposed major surface of the growth substrate 100 comprises a selected plane within the microstructure of the growth substrate 100. For example, the non-native growth substrate 100 may comprise sapphire with a (0001) crystallographic orientation in the direction designated by arrow 104, which is often referred to as "c-plane sapphire."

Figure 1B:
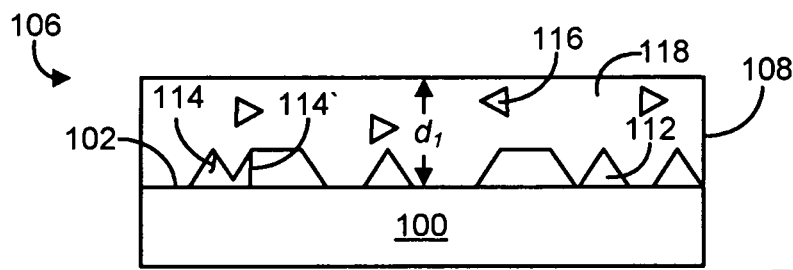

FIG. 1B illustrates structure 106 after forming a Group III-nitride material 108 over the non-native growth substrate 100. In some embodiments of the invention, the Group III-nitride material 108 may comprise a layer of a Group III-nitride material, such as, gallium nitride (GaN).

In greater detail, the Group III-nitride material 108 may include a plurality of structural features formed utilizing embodiments of the methods of the invention. Upon deposition, the Group III-nitride material 108 may comprise both amorphous and crystalline regions within the microstructure thereof. The microstructure of the Group III-nitride material 108 may include grains of crystalline metal nitride material 112 (i.e., crystals) embedded within and surrounded by substantially amorphous metal nitride material 118. As known in the art, "amorphous" means that there is substantially no long range order in the arrangement of the atoms of the material. In other words, the atoms of amorphous material are generally randomly arranged within the material, as opposed to being arranged in an ordered array of atomic planes within the material. It should be noted that the drawing of FIG. 1B is simplified, and, although identifiable, discrete boundaries are readily visible between the amorphous metal nitride material 118 in FIG. 11, in practice, such discrete boundaries extending around the peripheries of the grains of crystalline metal nitride material 112 may be relatively difficult to identify when the microstructure is viewed under magnification. Even so, the presence of the grains of crystalline metal nitride material 112 and the amorphous metal nitride material 118 can be identified upon viewing the microstructure under suitable magnification and/or using other techniques, such as X-ray diffraction (XRD).

Some grains of crystalline metal nitride material 112 may be disposed directly on and epitaxially aligned with the crystal lattice of the surface 102 of the substrate 100. For example, in embodiments in which the substrate 100 comprises an (0001) sapphire substrate and the Group III-nitride material 108 comprises gallium nitride (GaN), the surface 102 may comprise the (0001) plane of the sapphire crystal lattice, and the grains of crystalline GaN material 112 that are disposed directly on the surface 102 of the substrate 100 may be oriented such that the [0001] directions within the crystal lattices of those grains of crystalline GaN material 112 extend substantially perpendicular to the surface 102. The [0001] directions within each of the grains of crystalline metal nitride material 112 in FIG. 1B are represented by the directional arrows within the grains. Other directions within the crystal lattices of those grains of crystalline GaN material 112 also may extend substantially parallel to the corresponding directions within the crystal lattice of the underlying sapphire substrate 100 at the surface 102, such that there is little to no mismatch in the rotational orientation of those grains in the horizontal plane (i.e., the plane extending into the plane of the figures) relative to the crystal lattice of the underlying sapphire substrate 100 at the surface 102.

In embodiments in which the grains of crystalline metal nitride material 112 comprise gallium nitride (GaN), some or all of the grains of crystalline metal nitride material 112 may be or comprise grains of the wurtzite crystal structure.

The Group III-nitride material 108 may include one or more defects, such as, threading dislocations 114 and 114'. The threading dislocation 114' may originate from the upper surface 102 of the substrate 100. The threading dislocation 114 may originate from within the Group III-nitride material 108. As illustrated in FIG. 1B, the threading dislocations 114 and 114' may be located, for example, within one or more of the plurality of the wurtzite crystal structures 112.

The Group III-nitride material 108 may also include a plurality of misaligned crystal structures 116. For example, the plurality of misaligned crystal structures 116 may each be crystallographically misaligned with the upper surface 102 of the substrate 100.

The Group III-nitride material 108 may include amorphous metal nitride material 118. The amorphous metal nitride material 118 may include a group III-nitride material having a nonperiodic atomic array such that significant quantities of crystalline phases cannot be detected by conventional X-ray diffraction methods. For example, the amorphous metal nitride material 118 may include a material in which there may be no substantial long range order in the positioning of its constituent atoms. It is understood that such an amorphous group III-nitride material includes substantially amorphous materials that may include, for example, regions exhibiting limited short term order and/or short term crystallinity (e.g., over a few atomic or molecular spacings). For example, the amorphous metal nitride material 118 may substantially surround or envelop the plurality of wurtzite crystal structures 112 and/or the plurality of misaligned crystal structures 116.

One or more methods may be utilized for the formation of the Group III-nitride layer 108 over the upper surface 102 of the non-native growth substrate 100. In some embodiments of the methods of the invention, the Group III-nitride material 108 may comprise gallium nitride (GaN) and may be formed by a vapor phase deposition process. For example, the Group III-nitride material 108 may be deposited by an HVPE process utilizing a chlorinated gas chemistry. Although various types and configurations of HVPE systems may be employed in embodiments of the invention, FIGS. 3A and 3B schematically illustrate examples of HVPE systems that may be employed in embodiments of methods of the invention, as described herein.

Figure 3A:
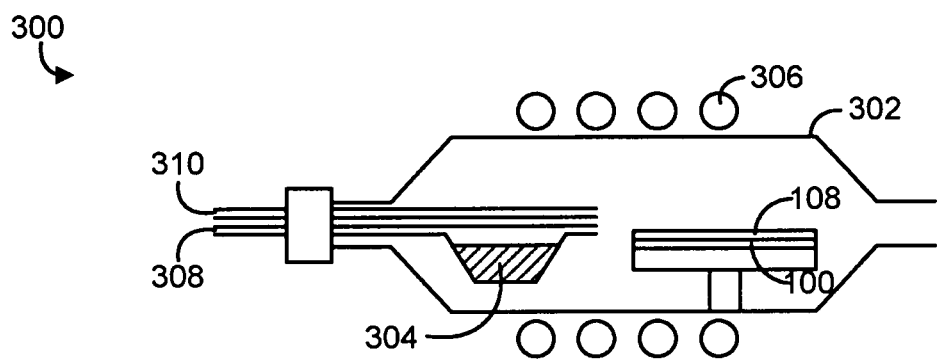
FIGS. 3A through 3B schematically illustrate example embodiments of systems for forming Group III-nitride semiconductor structures.
Figure 3B:
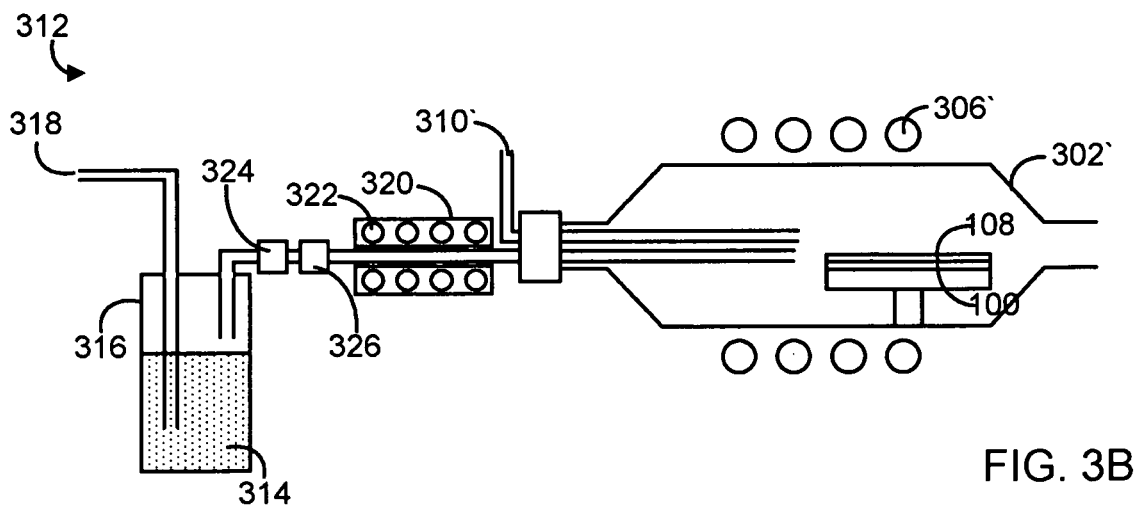

For example, FIG. 3A illustrates an HVPE system 300 comprising a reaction chamber 302 and an internal volume of a Group III source 304, such as, for example, liquid gallium. Heating of the non-native growth substrate 100 and the Group III source 304 may be provided by one or more heating elements 306, which may include, for example, lamps, resistive elements, and/or radio frequency elements.

One or more chlorine-containing species, for example chlorine vapor ($Cl_2$) or hydrogen chloride vapor (HCl), may be introduced through an inlet 308 and passed over and/or bubbled through the heated Group III source 304, to provide a Group III-chloride precursor, such as gallium chloride (GaCl), to the non-native growth substrate 100. The Group III-chloride precursor may react with a Group V precursor, such as for example, a nitrogen-containing species introduced through the inlet 310. The nitrogen-containing species may comprise ammonia ($NH_3$) or atomic nitrogen produced via a plasma source (not shown). The reaction between the Group III-chloride precursor and the nitrogen-containing species may lead to the formation of the Group III-nitride material 108 on growth surface of the heated non-native growth substrate 100. For examples of HVPE methods and systems utilizing a chlorinated gas chemistry comprising an internal volume of a Group III source, which may be employed in embodiments of the present invention, see U.S. Pat. No. 6,179,913 to Solomon et al. (issued Jan. 30, 2001) and U.S. Pat. No. 6,613,143 to Melnik et al. (issued Sep. 2, 2003).

In some embodiments, a Group III-chloride precursor, such as a gallium chloride precursor, may be introduced into the reaction chamber 302 from an external source. For example, FIG. 3B illustrates a HVPE system 312 comprising a reaction chamber 302' and an external volume of a Group III source 314, such as, for example, a liquid Group III-trichloride, such as gallium trichloride ($GaCl_3$). The Group III source 314 may be stored in an external vessel 316, wherein the external vessel 316 comprises heating apparatus (not shown) to maintain the Group III source 314 in a liquid form. The HVPE system 312 may also include an inlet 318 wherein one or more carrier gases may be introduced over and/or bubbled through the heated Group III source 314 to introduce the Group III-chloride precursor to the reaction chamber 302' wherein the non-native growth substrate 100 is exposed to the Group III-chloride precursor.

Embodiments of the invention utilizing an external Group III source may also include a Group III source pre-heater, such as, for example, a furnace 320. The furnace 320 may include one or more heating elements 322, such as lamps, resistive elements, and/or radio frequency elements, etc. The furnace 320 may be utilized to heat the Group III source 314 prior to entry into the reaction chamber 302'. Examples of Group III source pre-heaters that may be used in embodiments of methods of the invention are disclosed in U.S. Provisional Patent Application Ser. No. 61/157,112 to Arena et al. (filed Mar. 3, 2009).

In some embodiments, the Group III source 314 may be heated, prior to entry into the reaction chamber 302', in order to expose the non-native growth substrate 100 to a form of Group III-chloride precursor having a reduced concentration of chlorine species. For example, the Group III-chloride precursor may be heated to a temperature of greater than about 600° C., greater than about 800° C., or even greater than about 1,000° C., prior to introducing the Group III-chloride precursor into the reaction chamber 302'. By way of non-limiting example, the Group III source 314 (e.g., $GaCl_3$, $InCl_3$ and $AlCl_3$) may be reacted with at least one Group III species to form a Group III monochloride (e.g., GaCl, $InCl_3$ and AlCl). Heating the GaCl3 prior to entry into the reaction chamber produce the monochloride, i.e., GaCl, and the excess chloride produced becomes HCl be reaction with the carrier gas H2. The HCl does not incorporate in the deposited film so the Cl concentration in the film is reduced. For example, the Group III source 314 may comprise gallium trichloride ($GaCl_3$) and the forms of Group III-chloride precursor that is desired to be provided to the non-native growth substrate 100 may comprise gallium monochloride (GaCl).

Exposing the non-native growth substrate 100 to the Group III-chloride precursor comprising a Group III monochloride, such as gallium chloride (GaCl), during the HVPE process may provide a Group III-nitride layer including a substantially reduced concentration of chlorine species. Reducing the concentration of chlorine species within the Group III-nitride layer such as, for example, the Group III-nitride material 108 (of FIG. 1B), may substantially reduce or eliminate delamination and/or cracking of the Group III-nitride material 108. Further, reducing the concentration of the chlorine species within the Group III-nitride material 108 may substantially reduce or eliminate delamination and/or cracking of additional Group III-nitride material formed over the Group III-nitride material 108.

The preheated Group III-chloride precursor, such as gallium monochloride, may react with a Group V precursor, such as a nitrogen-containing species introduced through the inlet 310'. The nitrogen-containing species may comprise ammonia or atomic nitrogen (e.g., $NH_3$) produced via a plasma source (not shown). The reaction between the Group III-chloride precursor and the nitrogen-containing species may lead to the formation of the Group III-nitride material 108 (of FIG. 1B) on the heated non-native growth substrate 100. Examples of HVPE methods and systems utilizing a chlorinated gas chemistry comprising an external Group III source, such as a Group III trichloride source, are disclosed in U.S. Patent Application Publication No. 2009/0178611 A1 to Arena et al. (published Jul. 16, 2009) and U.S. Patent Application Publication No. 2009/0223442 A1 to Arena et al. (published Sep. 10, 2009).

Utilizing example HVPE system 300 (FIG. 3A) or HVPE system 312 (FIG. 3B), the Group III-nitride material 108 (of FIG. 1B) may be deposited at a temperature of less than about 900° C., or less than about 600° C., or even less than about 400° C. In addition, the pressure in the HVPE reaction chamber 302 (or 302') may be less than about 760 Torr during deposition of the Group III-nitride material 108.

In further embodiments, a flow rate of the Group III-chloride precursor into the HVPE system 300 (FIG. 3A) or the HVPE system 312 (FIG. 3B) may be substantially reduced to deposit the Group III-nitride layer 108 having a reduced concentration of chlorine species.

In embodiments in which the HVPE system 300 shown in FIG. 3A is used to deposit the Group III-nitride material 108, one or more chlorine-containing species may be introduced through the inlet 308 and passed over and/or bubbled through the heated Group III source 304. The heated Group III source 304 may comprise liquid gallium, utilized, to provide a Group III-chloride precursor, for example a gallium chloride precursor, to the non-native growth substrate 100. For example, the flow rate of a chlorine species over the Group III source 304 may be less than about 100 standard cubic centimeters per minute (sccm) and, more particularly, between about 50 sccm and about 25 sccm. By way of example and not limitation, the Group III-chloride precursor, such as gallium chloride, may be introduced to non-native growth substrate 100 at a flow rate of approximately less than 25 sccm and, more particularly, between about 10 sccm and about 1 sccm.

In embodiments in which the HVPE system 312 shown in FIG. 3B is used to deposit the Group III-nitride material 108, one or more carrier gas species, such as one or more of hydrogen, helium, nitrogen, and argon, may be introduced through inlet 318 and may be passed over and/or bubbled through the heated Group III source 314 (e.g., liquid gallium trichloride) to produce a Group III-chloride precursor (gallium trichloride and/or gallium monochloride vapor). The Group III precursor may be introduced to the non-native growth substrate 100 within the reaction chamber 302'. Methods of the invention may comprise a low flow rate of one or more carrier gas species over and/or through the Group III source 314. For example, the flow rate of the one or more carrier gas species over and/or through the Group III source 314 may comprise a flow rate of approximately less than 0.10 slm, or approximately less than 0.05 slm, or even approximately less than 0.02 slm.

Methods of the embodiments of the invention for providing a low flow rate of a Group III-chloride precursor to the non-native growth substrate 100 may also comprise controlling the temperature of the Group III source 314 via the external vessel 316. The temperature of the Group III source 314 may alter the viscosity of the Group III source 314 and consequently the amount of Group III-chloride precursor that is incorporated into the flowing carrier gas. For example, the temperature of the Group III source 314 may be less than about 250° C., less than about 150° C., or even less than about 100° C.

Further, a pressure over the Group III source 314 within the vessel 316 may be controlled to provide a low flow rate of a Group III-chloride precursor to the non-native growth substrate 100. For example, the pressure within the external vessel 316 may be controlled utilizing a back pressure regulator 324, which in turn may alter a rate at which the Group III-chloride precursor is incorporated into the flowing carrier gas. For example, the pressure over Group III source 314 within the vessel 316 may be less than about 1,000 Torr and, more particularly, may be between about 500 Torr and about 200 Torr.

Further embodiments of the invention may comprise providing a low flow rate of a Group III-chloride precursor to the non-native growth substrate 100 by utilizing a mass flow controller 326 to meter the flow of gaseous species therethrough. The mass flow controller 326 may be calibrated for the Group III-chloride species exiting the external vessel 316.

With continued reference to FIGS. 3A and 3B, HVPE system 300 and HVPE system 312 may also be utilized to deposit the Group III-nitride material 108 having a reduced concentration of chlorine species by providing a high flow rate of one or more Group V precursors (e.g., ammonia ($NH_3$) and/or nitrogen ($N_2$)). For example, the one or more Group V precursors, such as, ammonia or nitrogen, may be introduced through the inlet 310 (or 310'). The one or more Group V precursors may be introduced at a flow rate of greater than 1 slm, greater than 10 slm, or even greater than 100 slm. A ratio of the Group III-chloride precursor (e.g., gallium chloride) to the Group V precursor (e.g., ammonia) introduce to the non-native growth substrate 100 may be less than about 1,000, less than about 500, or even less than about 100.

Referring again to FIG. 1B, the Group III-nitride material 108 may be formed to have an average thickness $d_1$. The average thickness $d_1$ may be such that, during subsequent processes, the upper surface 102 of the non-native growth substrate 100 remains concealed. For example, the Group III-nitride material 108 may be formed to have an average thickness $d_1$ of greater than about 10 nm, greater than 50 nm, or even greater than 100 nm. The Group III-nitride material 108 may also be formed to an average thickness $d_1$ such that a substantially continuous Group III-nitride material 108 may be formed on the upper surface 102 of the non-native growth substrate 100.

Figure 1C:
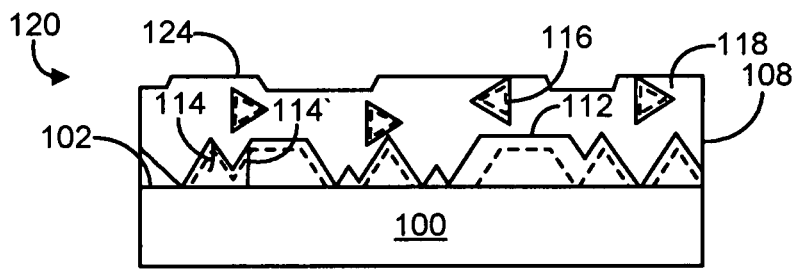
Figure 1D:
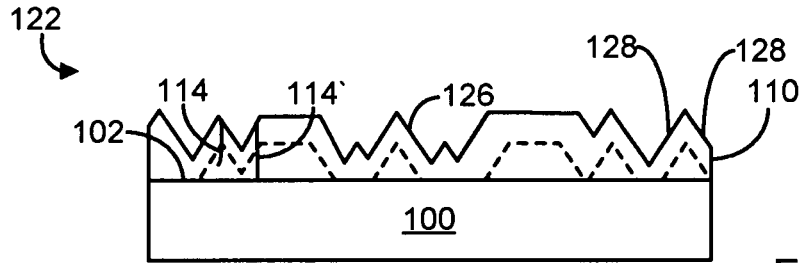

The structures 120 and 122, as shown in FIG. 1C and FIG. 1D, illustrate a non-limiting example of the formation of a nucleation material 110 (of FIG. 1D). The nucleation material 110 may be formed by thermally treating the Group III-nitride material 108 of FIG. 1B. Thus, the nucleation material 110 may comprise at least one layer of a Group III-nitride material, such as, gallium nitride. FIG. 1C illustrates structure 120, including the Group III-nitride material 108 at an intermediate stage in the thermal treatment process. FIG. 1D illustrates structure 122, including nucleation material 110, upon completion of the thermal treatment process.

One or more structural and/or chemical changes may occur to the Group III-nitride material 108 during the thermal treatment process, as illustrated in FIG. 1C. For example, at an intermediate stage of the thermal treatment process, a size of the plurality of wurtzite crystal regions 112 within the Group III-nitride material 108 may be increased. In FIG. 1C, boundaries of the plurality of wurtzite crystal regions 112 prior to thermal treatment of structure 106 are designated by phantom lines and boundaries of the plurality of wurtzite crystal regions 112 after modification by the thermal treatment are designated by solid lines. As shown in FIG. 1C, thermally treating the Group III-nitride material 108 results in growth of the wurtzite crystal regions 112. Such growth may occur as atoms in the amorphous metal nitride material 118 are incorporated into the crystal lattices of the wurtzite crystal regions 112. For example, growth of the wurtzite crystal regions 112 may be continued until coalescence occurs to form a continuous nucleation material 110.

In addition, an intermediate stage of thermally treating the Group III-nitride material 108 may comprise increasing the size of the plurality of misaligned crystal regions 116. In FIG. 1C, boundaries of the plurality of misaligned crystal regions 116 are designated by phantom lines (of FIG. 1C) and boundaries of the plurality of misaligned crystal regions 116 after thermal treatment are designated by solid lines. As shown in FIG. 1C, thermally treating the Group III-nitride material 108 results in growth of the misaligned crystal regions 116. Such growth may occur as atoms in the amorphous metal nitride material 118 are incorporated into the crystal lattices of the misaligned crystal regions 116.

In addition, an intermediate stage of thermally treating the Group III-nitride material 108 may comprise reducing the amount of the amorphous metal nitride material 118 in the Group III-nitride material 108. The material crystallographically misaligned with the substrate (i.e., the amorphous metal nitride material 118 and the misaligned crystal regions 116) is less stable than material that is crystallographically aligned with the substrate. During annealing, the less stable material crystallographically misaligned may evaporate more readily than the aligned material and may be redeposited over the aligned material—the aligned material acting as a template. Therefore, the redeposited material conforms to the crystal structure of the underlying aligned material. Also of note is that an intermediate stage of thermally treating Group III-nitride material 108 may also result in the Group III-nitride material 108 comprising the non-planar (on the atomic scale) surface 124, as illustrated in FIG. 1C.

One or more structural and/or chemical changes may occur within the Group III-nitride material 108 upon completion of thermally treating the Group III-nitride material 108. For example, thermally treating the Group III-nitride material 108. (of FIG. 1B) may be used to form the nucleation material 110 of FIG. 1D. In some embodiments, the nucleation material 110 may be formed from growth of the wurtzite crystal regions 112 into a substantially continuous wurtzite crystal layer during the thermal treatment process. As a non-limiting example, the nucleation material 110 may be formed adjacent to, or may be disposed directly on, the upper surface 102 of non-native growth substrate 100. In addition, the nucleation material 110 comprising the substantially continuous wurtzite crystal layer may be crystallographically aligned with the upper surface 102 of the non-native growth substrate 100. The phantom line (of FIG. 1D) represents a boundary of the plurality of wurtzite crystal regions 112 prior to thermally treating the structure 106 and the solid line represents a boundary of the Group III-nitride nucleation material 110 comprising the substantially continuous wurtzite crystal layer formed by thermally treating the structure 106. As previously discussed, the substantially continuous wurtzite crystal layer may form during thermal treatment as a result of atoms of the amorphous metal nitride material 118 in the Group III-nitride material 108 being incorporated into the crystal lattice structures of the wurtzite crystal regions 112.

Forming the nucleation material 110 may also include concealing the upper surface 102 of the non-native growth substrates 100. Concealing the upper surface 102 of the non-native growth substrate 100 may protect the upper surface 102 of the non-native growth substrate 100 from chlorine species within the HVPE reaction chamber 302 (FIG. 3A) and 302' (FIG. 3B). Protecting the upper surface 102 of the non-native growth surface 100 may aid in reducing (i.e., preventing) delamination and/or cracking of the nucleation material 110. In addition, protecting the upper surface 102 of the non-native growth surface 100 may aid in reducing (i.e., preventing) delamination and/or cracking of subsequent Group III-nitride layers formed over the nucleation material 110.

As mentioned above, during the thermal treatment process, the amorphous metal nitride material 118 of the Group III-nitride material 108 may be converted to crystalline material. For example, a portion of the amorphous metal nitride material 118 of the Group III-nitride material 108 may be converted to wurtzite crystalline material. For example, an amount of the amorphous metal nitride material 118 within the Group III-nitride material 108 may be incorporated into the wurtzite crystal regions 112 of the nucleation material 110, which is crystallographically aligned to the upper surface 102 of the non-native growth substrate 100.

In addition, thermally treating the Group III-nitride material 108 (of FIG. 1B) and, more particularly, thermally treating the plurality of misaligned crystal regions 116, may result in conversion of the plurality of the misaligned crystal regions 116 of the Group III-nitride material 108 to aligned crystalline material. In other words, the atoms of the misaligned crystal regions 116 may be incorporated into the more thermodynamically stable wurtzite crystal regions 112, and, hence, into the nucleation material 110, which is aligned to the upper surface 102 of the non-native growth substrate 100.

As shown in FIG. 1D, a surface 126 of the nucleation material 110 may be substantially non-planar on the atomic scale. For example, the substantially non-planar surface 126 may include a plurality of crystalline facets 128, some of which may be oriented at angles to the upper surface 102 of the growth substrate 100, and some of which may be oriented planar to the upper surface 102 of the growth substrate 100. In some embodiments, dislocations within the nucleation material 110, such as the threading dislocations 114 and 114', may intersect the crystalline facets 128.

In addition to the one or more structural modifications that may be result from thermally treating the Group III-nitride material 108 (of FIG. 1B), thermally treating the Group III-nitride material 108 may also result in chemical modification to some or all of the nucleation material 110. For example, embodiments of the methods of the invention may comprise selecting one or more thermal treatment parameters such that thermally treating the Group III-nitride material 108 comprises reducing a concentration of chlorine species in the nucleation material 110 formed therefrom.

The one or more thermal treatment parameters may also be selected such that the upper surface 102 of the non-native growth substrate 100 remains substantially concealed. Substantially concealing the upper surface of the non-native growth substrate 100 may substantially protect the upper surface 102 from chlorine species. For example, concealing the upper surface 102 of the non-native growth substrate 100 may provide protection from chlorine species within a HVPE system, such as the HVPE system 300 or the HVPE system 312, as illustrated in FIG. 3A and FIG. 3B respectively. As previously noted, reducing the concentration of chlorine species in the nucleation material 110 may reduce (i.e., prevent) delamination and/or cracking of the nucleation material 110 and may reduce (i.e., prevent) delamination and/or cracking of subsequent Group III-nitride layers formed upon the nucleation material 110.

Reducing the concentration of chlorine species in the nucleation material 110 may comprise selecting one or more parameters for thermally treating the Group III-nitride material 108 utilized to form the nucleation material 110. Thermally treating the Group III-nitride material 108 may comprise annealing the Group III-nitride material 108 (of FIG. 1B) under controlled conditions in a controlled environment.

For example, the Group III-nitride material 108 maybe annealed by exposing the structure 106 (FIG. 1B) to an increased temperature in a HVPE system, such as HVPE system 300 or HVPE system 312 (FIGS. 3A and 3B). The one or more heating elements 306 and 306', of the respective HVPE systems 300 and 312 may provide the thermal energy for annealing. The Group III-nitride layer 108 may be deposited and annealed in-situ in the HVPE system 300, 312 to eliminate moving the structure 106 between different processing systems.

The nucleation material 110 may be annealed by exposing the Group III-nitride material 108 (of FIG. 1B) to a temperature of less than about 900° C., less than about 700° C., or even less than about 600° C. For example, the Group III-nitride material 108 may be annealed for a period of less than twenty minutes (20 min), less than ten minutes (10 min), or even less than five minutes (5 min).

Further methods of embodiments of the invention may comprise reducing the concentration of chlorine species in the nucleation material 110 by exposing the Group III-nitride material 108 to a gas comprising a compound or material that binds, absorbs or adsorbs the chlorine species (i.e., a "getter" for chlorine species). By way of example and not limitation, getters for chlorine may include hydrogen radicals (e.g., $NH_x$ radicals), hydrogen ($H_2$) and dihydrazine ($N_2H$.). For example, the Group III-nitride material 108 (of FIG. 1B) may be exposed to an atmosphere comprising ammonia ($N_{H3}$), and the ammonia may act as a getter for chlorine. The getter may remove at least a portion of the chlorine species from the Group III-nitride material 108. For example, after deposition of the Group III-nitride material 108 in the HVPE system 300 or 312, ammonia ($N_{H3}$) may be introduced into the heated HVPE system 300 or 312) at a flow rate of greater than 1 slm, greater than 10 slm, or even greater than 100 slm.

In further embodiments, a pressure at which the Group III-nitride layer 108 is annealed, for example, the pressure within the HVPE system 300 or 312, may be selected for reducing the concentration of chlorine species in the nucleation material 110. In embodiments in which the Group III-nitride material 108 is annealed in the reaction chamber 102 of the HVPE system 300 or 312, the pressure within the reaction chamber 102 may be at a pressure of less than 700 Torr, less than 200 Torr, or even less than 10 Torr.

The methods of the invention for reducing the concentration of chlorine in the nucleation material 110 may further comprise reducing the concentration of chlorine species proximate the surface 126 the nucleation material 110 (of FIG. 1D) to less than $5\times10^{19}$ cm$^{-3}$, less than $5\times10^{18}$ cm$^{-3}$, or even less than $5\times10^{17}$ cm$^{-3}$. In particular, some embodiments of methods of the invention may comprise reducing the concentration of chlorine species proximate the interface between the nucleation material 110 (of FIG. 1D) and the non-native growth substrate 100 to less than $5\times10^{19}$ cm$^{-3}$, less than $5\times10^{18}$ cm$^{-3}$, or even less than $5\times10^{17}$ cm$^{-3}$.

Figure 1E:
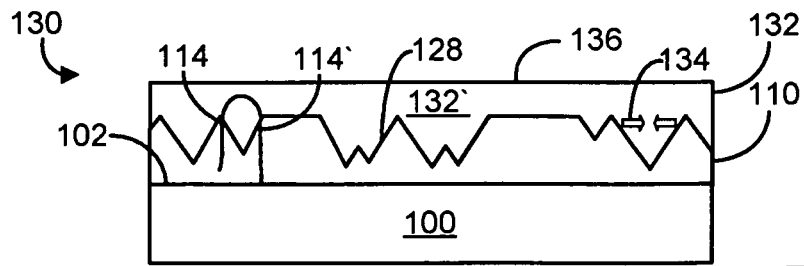
Figure 1F:
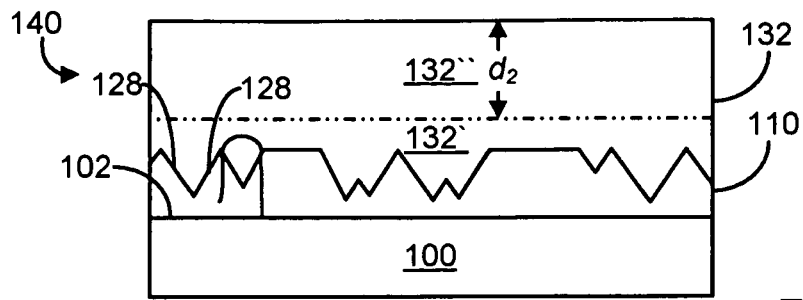

As shown in FIGS. 1E and 1F, a further Group III-nitride material 132 may be formed over the nucleation material 110 to respectively form structures 130 and 140. The Group III-nitride material 132 may comprise, for example, a layer of a Group III-nitride material, such as, gallium nitride. The further Group III-nitride material 132 may comprise a lateral Group III-nitride region 132' and a bulk Group III-nitride region 132", as will be described in further detail. FIG. 1E illustrates forming the lateral Group III-nitride region 132', whereas FIG. 1F illustrates forming the bulk Group III-nitride region 132".

Methods for forming the further Group III-nitride material 132 may utilize one or more formation parameters such that the upper surface 102 of the non-native growth substrate 100 remains substantially concealed. For example, the upper surface 102 of the non-native growth substrate 100 may remain substantially concealed by the nucleation material 110 such that the upper surface 102 does not become exposed to further chlorine species. With reference to FIG. 1E, forming the further Group III-nitride material 132 upon the nucleation material 110 may comprise inducing growth of the nucleation material 110 in the lateral direction relative to the upper surface 102 of the growth substrate 100. Such lateral growth may be established by selecting the growth conditions to favor addition of material to the crystalline facets 128 that are oriented at angles to the upper surface 102 of the growth substrate 100 relative to addition of material to the crystalline facets 128 oriented parallel to the upper surface 102, as discussed in further detail below. The lateral growth of the nucleation material 110 may occur as a result of crystallization of the amorphous metal nitride material 118 surrounding the nucleation material 110. As lateral growth proceeds, the amorphous metal nitride material 118 may be converted to crystalline material having substantially the same crystal lattice structure as the nucleation material 110. The lateral growth may commence from the angled crystalline facets 128, and may progress in the lateral directions, as illustrated by the directional arrows 134 of FIG. 1E. The lateral growth from the angled crystalline facets 128 may proceed until they coalesce to form lateral Group III-nitride region 132'. For example, the lateral Group III-nitride region 132' formed by the lateral growth of the nucleation material 110 may comprise a substantially planar upper surface 136.

By way of example and not limitation, vertical and lateral growth process may be performed using a conventional deposition process, e.g., for MOCVD, or HVPE processes. Examples of such depositions processes are disclosed in U.S. Pat. No. 6,325,850 to Beaumont et al. (date of patent Dec. 4, 2001) and also Phys. Stats. Sol (c) 3, No. 6 1750-1753 (2006). Generally, the relative rates of lateral versus vertical growth may be influenced by growth temperature, Group V to Group III precursor ratio in the process gases, composition of the carrier gas species, and reactor chamber pressure. For example, lateral growth may be enhanced by at least one of increased deposition temperatures, increased ratio of Group V to Group III precursors, a greater $N_2$ to $H_2$ ratio, and reduced deposition pressures of, for example, about one atmosphere (1 atm) or less.

Growing laterally from the plurality of angled crystalline facets 128 may further comprise bending the propagation direction of a plurality of dislocations. When the material is converted to all crystalline the defects will propagate as the amorphous metal nitride material 118 and the misaligned crystal regions 116 are evaporated and redeposited. The defect may tend to bend towards a low energy surface to reduce the energy of the system, the low energy surface being the surface of the growth substrate 100. As illustrated in FIG. 1E laterally growing from the plurality of orientated crystalline side facets 128 may promote bending of the propagation direction of the dislocation 114 and the dislocation 114'. Promoting bending of the propagation direction of a plurality of dislocations may comprise promoting dislocation reduction by dislocation interception and dislocation annihilation. Reducing the dislocation density in the further Group III-nitride material 132 by bending of the propagation of the plurality of dislocations may comprise forming the further Group III-nitride material 132 having a density of threading dislocations at an exposed major surface thereof less than $5 \times 10^9$ cm$^{-2}$, less than $5 \times 10^8$ cm$^{-2}$, or even less than $1 \times 10^7$ cm$^{-2}$.

As illustrated in FIG. 1F, the further Group III-nitride material 132 may further include a bulk Group III-nitride region 132". The bulk Group III-nitride region 132" may be formed, for example, by a conventional HVPE process. By way of example and not limitation, the bulk Group III-nitride region 132" may be formed to a thickness $d_2$ of greater than approximately 10 microns, greater than 50 microns, or even greater than 100 microns. It should also be appreciated that methods of the invention may comprise depositing the bulk Group III-nitride region 132" such that the structure 140 of FIG. 1F may be substantially free of structural cracks and delaminated regions of the Group III-nitride material 132.

Further embodiments of the invention are described below with reference to FIGS. 2A through 2F. The embodiments illustrated in FIGS. 2A through 2F are substantially similar to those previously described with reference to FIGS. 1A through 1F. In the embodiments of FIGS. 2A through 2F, however, the nucleation material 210 may be formed from one or more Group III-nitride layers, each of which may be subjected to a thermal treatment. For example, forming a continuous nucleation material 210 may comprise repeating one or more times the acts of (1) depositing a Group III-nitride layer (as previously described herein), and (2) thermally treating the Group III-nitride layer (as previously described herein). The Group III-nitride nucleation layer formed from the one or more thermally treated Group III-nitride material layers (e.g., layers of Group III-nitride material) of the further embodiments of the invention may have a reduced concentration of chlorine species therein.

Figure 2A:
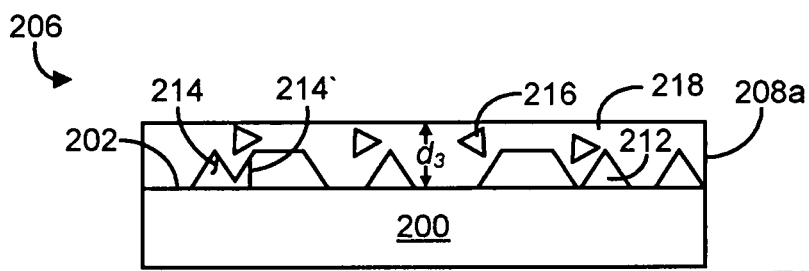
FIGS. 2A through 2F schematically illustrate additional example embodiments of the invention for forming Group III-nitride semiconductor structures.
Figure 2B:
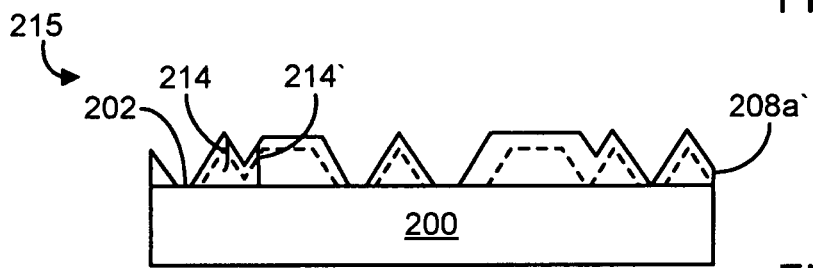
Figure 2C:
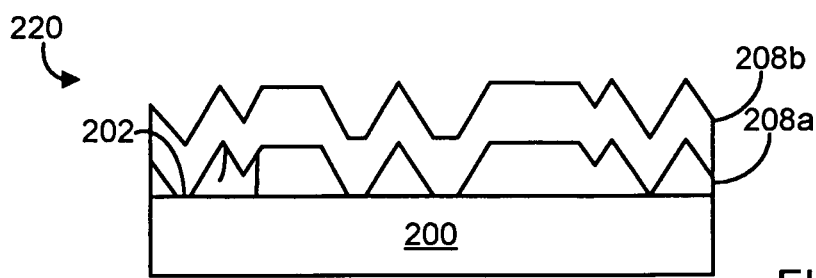

In greater detail, FIGS. 2A-2F illustrate further embodiments of the methods of the invention for forming a continuous nucleation layer 210 (FIG. 2D) comprising one or more layers of a Group III-nitride material, such as Group III-nitride layers, 208a and 208b of FIGS. 2A and 2C respectively.

FIG. 2A illustrates a structure 206 comprising a non-native growth substrate 200 and Group III-nitride layer 208a. The non-native growth substrate 200 may generally be similar to non-native growth substrate 100 of FIG. 1A, and may comprise, for example, a c-plane sapphire growth substrate. The Group III-nitride layer 208a may generally be similar to the Group III-nitride material 108 of FIG. 1B, and may include a plurality of wurtzite crystal regions 212, a plurality of misaligned crystal regions 216, and amorphous metal nitride material 218, as illustrated in FIG. 2A. Methods for forming the Group III-nitride layer 208a may be generally similar to those described above for Group III-nitride material 108 of FIG. 1B.

Methods of the further embodiments of the invention may comprise forming the Group III-nitride layer 208a to an average thickness of approximately 100 nm or less, approximately 50 nm or less, or even approximately 10 nm or less. As a non-limiting example, the Group III-nitride layer 208a (of FIG. 2A) may be formed to an average thickness $d_3$ between about 10 nm and about 50 nm.

In general, the average thickness of each of the one or more Group III-nitride layers utilized to form the nucleation material 210 may be less than the thickness $d_1$ of the nucleation material 110 of FIG. 1B. Reducing the thickness of the one or more Group III-nitride layers 208a and 208b utilized in forming the nucleation material 210 may further reduce the concentration of chlorine species in the nucleation material 210 formed therefrom. As described herein, reducing the concentration of chlorine species in the Group III-nitride nucleation layer may reduce (i.e., prevent) delamination and/or cracking in the nucleation material 210 and further Group III-nitride material (e.g., layers of Group III-nitride material) formed thereon.

Methods of the further embodiments of the invention may further comprise thermally treating each of the one or more layers of the Group III-nitride layers 208a and 208b, utilizing systems and methods as described above. In general, thermally treating the one or more layers of the Group III-nitride layers 208a and 208b may result in generally similar structural and/or chemical changes in the one or more layers of the Group III-nitride layers 208a and 208b as seen in nucleation material 110. In general thermally treating the one or more Group III-nitride layers may comprise reducing the concentration of chlorine in nucleation material 210 to less than $5 \times 10^{19}$ cm$^{-3}$, or less than $5 \times 10^{18}$ cm$^{-3}$, or even $5 \times 10^{17}$ cm$^{-3}$.

In addition, thermally treating each of the one or more layers of Group III-nitride material may form a discontinuous Group III-nitride material. For example, FIG. 2B illustrates thermally treated Group III-nitride layer 208a' on an upper surface 202 of non-native growth substrate 200. Thermal treating the Group III-nitride layer 208a' may form a discontinuous Group III-nitride layer 208a' on the upper surface 202 of non-native growth substrate 200. The one or more of the layers of Group III-nitride material, such as for example the Group III-nitride layer 208a (of FIG. 2A), may be formed to a thickness $d_3$, wherein thickness $d_3$ may be such that during subsequent methods of the embodiments of the invention, the upper surface 202 of non-native growth substrate 200 may become exposed, resulting in exposed regions of the upper surface 202 of the non-native growth substrate 200.

Figure 2D:
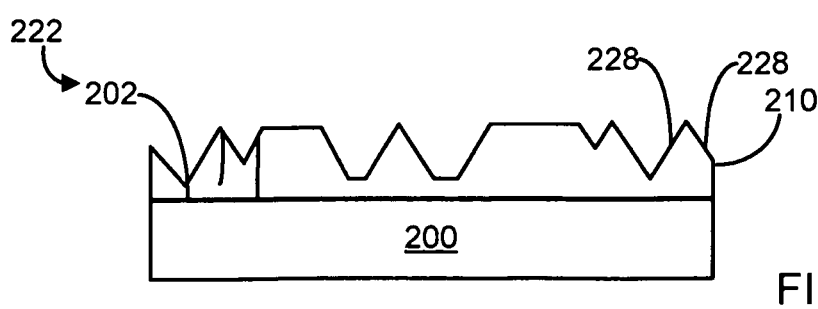
Figure 2E:
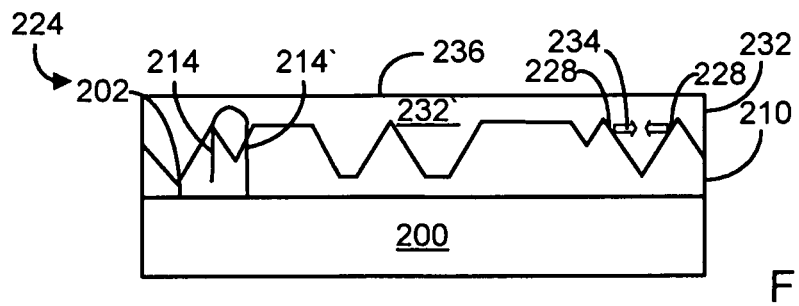

FIG. 2C illustrates structure 220 comprising non-native growth substrate 200 and one or more of the layers of the Group III-nitride material, including thermally treated Group III-nitride layers 208a' and Group III-nitride layer 208b. The Group III-nitride layer 208b may be formed upon the thermally treated Group III-nitride layer 208a' (of FIG. 2D) using methods as described above and may be formed to an average thickness of approximately 100 nm or less, approximately 50 nm or less, or even approximately 10 nm or less, as previously described. The one or more the layers of the Group III-nitride layers, such as the Group III-nitride layer 208b, may also be thermally treated upon formation of each addition of a layers of the Group III-nitride material, as shown in FIG. 2D utilizing methods as previously described. The methods of forming and thermally treating may be repeated until a continuous nucleation material 210 comprising a continuous wurtzite crystal layer may be formed upon the upper surface 202 of non-native growth substrate 200.

FIG. 2D illustrates structure 222 comprising non-native growth substrate 200 and continuous nucleation material 210 formed from the one or more thermally treated Group III-nitride layers. Continuous nucleation material 210 may comprise a continuous wurtzite crystal layer, as described above, wherein the continuous wurtzite crystal layer may be provided adjacent to upper surface 202 of non-native growth substrate 200 and wherein the nucleation material 210 comprising a continuous wurtzite crystal layer may also be crystallographically aligned with the crystal structure of the upper surface 202 of the non-native growth substrate 200.

Methods of the further embodiments of the invention may comprise forming a further Group III-nitride material 232 (e.g., a layer of gallium nitride) upon the nucleation material 210, using substantially the same methods as previously described with respect to FIGS. 1E and 1F. Briefly, the further Group III-nitride material 232 may be formed over the nucleation material 210 by initiating growth of crystalline material in a lateral direction (i.e., lateral growth) from the plurality of angled crystalline facets 228 to form lateral Group III-nitride region 232'. As previously discussed, the lateral growth may occur as the amorphous metal nitride material 218 surrounding the nucleation material 210 is converted to crystalline material having substantially the same crystal lattice structure as the nucleation material 210. The lateral growth may commence from angled crystalline facets 228 and progress in a lateral direction, as illustrated by the directional arrows 234 of FIG. 2E, until lateral growth from the plurality of angled crystalline facets 228 coalesce to form the lateral Group III-nitride region 232', the lateral Group III-nitride region 232' have a substantially planar upper surface 236. Growing laterally from the plurality of orientated crystalline side facets 228 may further comprise bending a number of dislocations, such as threading dislocations 214 and 214' and annihilating a number of the threading dislocations 214 and 214' as previously described.

Figure 2F:
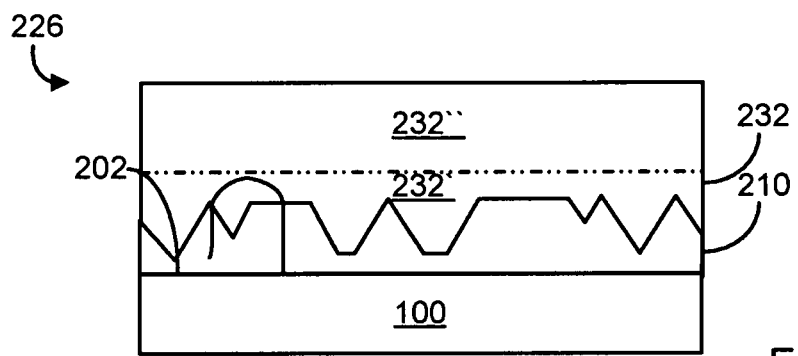

Methods of embodiments of the invention may further comprise forming a further Group III-nitride layer 232 including bulk Group III-nitride region 232", as illustrated in FIG. 2F. Depositing bulk Group III-nitride region 232" may further comprise depositing the bulk Group III-nitride region 232" to a thickness $d_2$ of greater than approximately 5 microns great than 10 microns, or even greater than 50 microns. It should also be appreciated that methods of the invention may comprise depositing the bulk Group III-nitride region 232" such that structure 226 of FIG. 2F may be substantially free of structural cracks and regions of delaminated Group III-nitride material.

The various embodiments of the invention may also include structures and, more specifically, Group III-nitride semiconductor structures. For example, FIG. 1B illustrates the Group III-nitride semiconductor structure 106 comprising a substantially continuous metal layer 108 on the upper surface 102 of the non-native growth substrate 100. The substantially continuous Group III-nitride layer 108 may comprise a plurality of wurtzite crystal regions 112 adjacent to the upper surface 102 of the non-native growth substrate 100 and the plurality of wurtzite crystal regions 112 may be crystallographically selectively aligned to the crystal structure of the upper surface 102 of the non-native growth substrate 100.

The Group III-nitride semiconductor structure 106 may also comprise an amorphous metal nitride material 118, the amorphous metal nitride material 118 enveloping the plurality of wurtzite crystal regions 112. In addition, the Group III-nitride semiconductor structure 106 may also comprise a plurality of misaligned crystal regions 116, the plurality of misaligned crystal structures being disposed within the amorphous metal nitride material 118.

In some embodiments of the invention, non-native growth substrate 100 of Group III-nitride semiconductor structure 100 may substantially comprise alpha aluminum oxide ($\alpha$-$Al_2O_3$), i.e., sapphire. The upper surface 102, which is the growth surface, of the non-native growth substrate 100 may also predominantly comprise sapphire.

In addition, the plurality of wurtzite crystal regions 112, the amorphous metal nitride material 118 and the plurality of misaligned crystal regions 116 may be at least substantially comprised of one or more of gallium nitride, indium nitride, aluminum nitride, and alloys thereof.

The various embodiments of the invention may also include Group III-nitride semiconductor structures like the Group III-nitride semiconductor structure 140 shown in FIG. 1F. The Group III-nitride semiconductor structure 140 may comprise a substantially continuous nucleation material 110 on the upper surface 102 of the non-native growth substrate 100. The continuous nucleation material 110 may itself comprise a continuous wurtzite crystal layer crystallographically aligned to the crystal structure of the upper surface 102 of the non-native growth substrate 100. The Group III-nitride semiconductor structure 140 may also comprise the further Group III-nitride material 132 upon the substantially continuous nucleation material 110.

In some embodiments of the invention, non-native growth substrate 100 of the Group III-nitride semiconductor structure 140 may be at least substantially comprised of alpha aluminum oxide ($\alpha$-$Al_2O_3$), i.e., sapphire. The upper surface 102, which is the growth surface, of the non-native growth substrate 100 may also be at least substantially comprised of sapphire.

The substantially continuous nucleation material 110 may have an average thickness of greater than about 10 nm, greater than about 50 nm, or even greater than about 100 nm. In addition, the substantially continuous nucleation material 110 may also comprise a plurality of angled crystalline facets 128 oriented at an acute angle greater than zero relative to the upper surface 102 of the substrate 100, and may have a concentration of chlorine species of less than approximately $7 \times 10^{19}$ cm$^{-2}$.

What is claimed is:

1. A method of forming a Group III-nitride material on a growth substrate, comprising:
    forming a Group III-nitride nucleation layer over a surface of a non-native growth substrate, comprising:
        depositing a Group III-nitride layer comprising a plurality of wurtzite crystal structures, the plurality of wurtzite crystal structures formed simultaneously with the deposition of the Group III-nitride layer, on an upper surface of the non-native growth substrate using a halide vapor phase epitaxy (HVPE) process; and
        after depositing the Group III-nitride layer comprising the plurality of wurtzite crystal structures, thermally treating the Group III-nitride layer; and
    forming a further Group III-nitride layer over the nucleation layer.

2. The method of claim 1, wherein depositing a Group III-nitride layer comprising a plurality of wurtzite crystal structures on an upper surface of the non-native growth substrate comprises depositing the Group III-nitride layer comprising a plurality of wurtzite crystal structures adjacent to the upper surface of the non-native growth substrate.

3. The method of claim 1, wherein thermally treating the Group III-nitride layer comprises exposing the Group III-nitride layer to a temperature of less than about 900° C. to reduce a concentration of a chlorine species within the Group III-nitride nucleation layer.

4. The method of claim 1, wherein thermally treating the Group III-nitride layer comprises introducing the Group III-nitride layer to at least one getter for chlorine species to reduce a concentration of a chlorine species within the Group III-nitride nucleation layer.

5. The method of claim 1, wherein thermally treating the Group III-nitride layer comprises forming a continuous wurtzite crystal layer adjacent to the upper surface of the non-native growth surface, the continuous wurtzite crystal layer being crystallographically aligned with the upper surface of the non-native growth substrate.

6. The method of claim 1, wherein depositing a Group III-nitride layer comprises depositing the a Group III-nitride layer having a thickness of less than about 100 nm.

7. The method of claim 1, wherein forming a Group III-nitride nucleation layer over a surface of a non-native growth substrate comprises flowing a Group III monochloride into a reaction chamber containing the non-native growth substrate.

8. A method of forming a Group III-nitride material on a growth substrate, comprising:
    depositing a Group III-nitride material over a surface of a sapphire growth substrate using a halide vapor phase epitaxy (HVPE) process, the Group III-nitride material comprising a plurality of wurtzite crystal structures crystallographically aligned with the surface of the sapphire growth substrate, the plurality of wurtzite crystals formed simultaneously with the deposition of the Group III-nitride material; and
    after depositing the Group III-nitride material comprising the plurality of wurtzite crystal structures, thermally treating the Group III-nitride material to form a Group III-nitride nucleation material extending substantially continuously over the surface of the sapphire growth substrate.

9. The method of claim 8, wherein depositing a Group III-nitride material comprises depositing a layer of the Group III-nitride material having an average thickness of less than about 100 nm.

10. The method of claim 8, wherein depositing a Group III-nitride material over a surface of a sapphire growth substrate using a halide vapor phase epitaxy (HVPE) process comprises:
    selecting a Group III trichloride as a Group III precursor source;
    heating the Group III trichloride to a temperature of greater than about 700° C.; and
    flowing the Group III trichloride into a reaction chamber.

11. The method of claim 8, wherein thermally treating the Group III-nitride layer further comprises exposing the Group III-nitride layer to a temperature of less than about 900° C. in an atmosphere comprising ammonia ($NH_3$), nitrogen ($N_2$) and hydrogen ($H_2$).

12. The method of claim 8, wherein thermally treating the Group III-nitride layer to form a Group III-nitride nucleation material extending substantially continuously over the surface of the sapphire growth substrate comprises reducing a concentration of a chlorine species within the Group III-nitride nucleation material to less than about $1\times10^{19}/cm^3$.

13. The method of claim 8, wherein depositing a Group III-nitride layer comprises introducing a Group III-chloride precursor to the surface of the sapphire growth substrate at a flow rate of less than about 10 standard cubic centimeters per minute.

14. The method of claim 8, wherein depositing a Group III-nitride material using a halide vapor phase epitaxy (HVPE) process and thermally treating the Group III-nitride material are performed in a single reaction chamber.

15. The method of claim 8, further comprising repeating the depositing and thermally treating to increase a thickness of the Group III-nitride nucleation material.

* * * * *